US012747502B2

(12) United States Patent
Chen et al.

(10) Patent No.: US 12,747,502 B2
(45) Date of Patent: Sep. 29, 2026

(54) PLASMA SHOWERHEAD ASSEMBLY AND METHOD OF REDUCING DEFECTS

(71) Applicant: Applied Materials, Inc., Santa Clara, CA (US)

(72) Inventors: Hanhong Chen, Milpitas, CA (US); Kenneth Brian Doering, San Jose, CA (US); Sanjeev Baluja, Campbell, CA (US); Chi-Chou Lin, San Jose, CA (US); Kevin Griffin, Livermore, CA (US); Joseph AuBuchon, San Jose, CA (US); Zhejun Zhang, Santa Clara, CA (US); Rohit Ode, Morgan Hill, CA (US); Tejas Umesh Ulavi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 19/320,747

(22) Filed: Sep. 5, 2025

(65) Prior Publication Data

US 2026/0002261 A1 Jan. 1, 2026

Related U.S. Application Data

(63) Continuation of application No. 18/627,046, filed on Apr. 4, 2024, now Pat. No. 12,442,080.
(Continued)

(51) Int. Cl.
*C23C 16/455* (2006.01)
*H01J 37/32* (2006.01)

(52) U.S. Cl.
CPC .. *C23C 16/45565* (2013.01); *C23C 16/45536* (2013.01); *H01J 37/32201* (2013.01);
(Continued)

(58) Field of Classification Search
CPC ......... C23C 16/45565; C23C 16/45536; H01J 37/32201; H01J 37/3222; H01J 37/3244;
(Continued)

(56) References Cited

U.S. PATENT DOCUMENTS

| | | | |
|---|---|---|---|
| 9,291,266 | B2 | 3/2016 | Yu |
| 10,072,776 | B2 | 9/2018 | Kocourek |

(Continued)

FOREIGN PATENT DOCUMENTS

| | | | | |
|---|---|---|---|---|
| KR | 20140102154 A1 | 8/2014 | | |
| KR | 102193666 B1 | * 12/2020 | ........ | H01L 21/67011 |

(Continued)

OTHER PUBLICATIONS

"PCT International Search Report and Written Opinion in PCT/US2024/055029 dated Feb. 20, 2025, 11 pages".

*Primary Examiner* — Adam D Houston
(74) *Attorney, Agent, or Firm* — SERVILLA WHITNEY LLC

(57) ABSTRACT

Plasma showerhead assemblies are disclosed comprising a conductive plate having a plurality of the conductive plate gas openings, a dielectric faceplate having a thickness and a plurality of dielectric faceplate gas openings extending through the dielectric faceplate thickness in fluid communication with the plurality of the conductive plate gas openings. A conductive insert is disposed within at least one of the dielectric faceplate gas openings or adjacent o-rings included in the plasma showerhead assemblies.

19 Claims, 5 Drawing Sheets

Related U.S. Application Data

(60) Provisional application No. 63/599,830, filed on Nov. 16, 2023.

(52) U.S. Cl.
CPC ...... *H01J 37/3222* (2013.01); *H01J 37/3244* (2013.01); *H01J 37/32477* (2013.01); *H01J 2237/3321* (2013.01); *H01J 2237/3323* (2013.01)

(58) Field of Classification Search
CPC ......... H01J 37/32477; H01J 2237/3321; H01J 2237/3323
See application file for complete search history.

(56) References Cited

U.S. PATENT DOCUMENTS

| | | | | |
|---|---|---|---|---|
| 10,487,401 | B2 * | 11/2019 | Kurita | C23C 16/45565 |
| 11,049,694 | B2 | 6/2021 | Aubuchon et al. | |
| 11,881,384 | B2 | 1/2024 | Carducci et al. | |
| 12,334,332 | B2 * | 6/2025 | Varadarajan | H10P 14/6336 |
| 12,354,877 | B2 * | 7/2025 | Zope | C23C 16/14 |
| 12,359,311 | B2 * | 7/2025 | Weimer | C23C 16/325 |
| 2006/0137608 | A1 * | 6/2006 | Choi | C23C 16/45512 118/715 |
| 2008/0191474 | A1 | 8/2008 | Kotz | |
| 2008/0242085 | A1 | 10/2008 | Fischer et al. | |
| 2013/0092086 | A1 | 4/2013 | Keil et al. | |
| 2015/0020848 | A1 | 1/2015 | Kim et al. | |
| 2015/0214015 | A1 * | 7/2015 | Kikuchi | H01J 37/32651 423/325 |
| 2018/0174870 | A1 * | 6/2018 | Yang | H01J 37/32146 |
| 2018/0230597 | A1 * | 8/2018 | Ma | H01J 37/32 |
| 2019/0252161 | A1 | 8/2019 | Sheng et al. | |
| 2020/0040455 | A1 * | 2/2020 | Kho | C23C 16/45553 |
| 2021/0050186 | A1 * | 2/2021 | Chen | H01J 37/32201 |
| 2021/0098231 | A1 | 4/2021 | Carducci et al. | |
| 2022/0093407 | A1 | 3/2022 | Tamamushi | |
| 2023/0162947 | A1 | 5/2023 | Ye et al. | |
| 2023/0187181 | A1 * | 6/2023 | Lin | C23C 16/45565 118/723 I |
| 2023/0366089 | A1 * | 11/2023 | Bapat | C23C 16/455 |
| 2024/0062993 | A1 * | 2/2024 | Salinas | H01J 37/3244 |
| 2025/0163578 | A1 | 5/2025 | Chen et al. | |
| 2025/0166973 | A1 * | 5/2025 | Ode | H01J 37/3244 |
| 2025/0259823 | A1 * | 8/2025 | Yang | H01J 37/32247 |
| 2025/0316455 | A1 | 10/2025 | Chen et al. | |

FOREIGN PATENT DOCUMENTS

| | | | | | |
|---|---|---|---|---|---|
| WO | 2013046239 | A1 | | 4/2013 | |
| WO | WO-2021021537 | A1 | * | 2/2021 | C23C 16/509 |

* cited by examiner

PLASMA SHOWERHEAD ASSEMBLY AND METHOD OF REDUCING DEFECTS

CROSS REFERENCE TO RELATED APPLICATIONS

The present disclosure claims priority to U.S. provisional patent application Ser. No. 63/599,830, filed on Nov. 16, 2023 and is a continuation of U.S. application Ser. No. 18/627,046, filed on Apr. 4, 2024, the entire disclosures of which are hereby incorporated by reference herein.

TECHNICAL FIELD

Embodiments of the disclosure generally relate to the field of semiconductor device manufacturing. More particularly, embodiments of the disclosure are directed to plasma showerhead assemblies used in the manufacture of semiconductor devices and methods for reducing defect generation in microwave plasma processing chambers.

BACKGROUND

The semiconductor processing industry continues to strive for larger production yields while increasing the uniformity of layers deposited on substrates such as semiconductor wafers having larger surface areas. As circuit integration increases, the need for greater uniformity and process control of layer thickness rises.

Chemical vapor deposition (CVD) is a common deposition processes employed for depositing layers on substrates. CVD involves control of the substrate temperature and the precursors to produce a desired layer of uniform thickness. Cyclical deposition or atomic layer deposition (ALD) involves sequential delivery of precursor molecules on a substrate surface. In one example, an ALD cycle includes exposing the substrate surface to a first precursor, a first purge gas, a second precursor, and a first purge gas. The first and second precursors react to form a product compound as a layer (or film) on the substrate surface. The cycle is repeated to form the film to a desired thickness. CVD and ALD methods to deposit a variety of films, for example, silicon oxide and silicon nitride ($Si_xN_y$) films on a substrate such as a semiconductor wafer are performed in a substrate processing chamber. Precursor and/or reactant gases may be flowed through a showerhead having a plurality of gas openings through which the gases flow.

Existing showerhead assemblies used in high charge and plasma densities such as microwave plasma contribute to defect and particle generation due to light up of plasma in the gas openings. There is a need to provide improved plasma showerhead assemblies that prevent light up of plasma in the gas openings leading to particle and defects generation in higher plasma density deposition processes such as PEALD, in particular, processes that utilize microwave plasmas.

SUMMARY

One or more embodiments of the disclosure are directed to a plasma showerhead assembly comprising a conductive plate including a first surface and a second surface opposite to the first surface defining a conductive plate thickness, a plurality of resonator openings extending through the conductive plate thickness, a plurality of gas channels formed between the first surface and the second surface of the conductive plate, and a plurality of the conductive plate gas openings extending from the second surface of the conductive plate in fluid communication with the plurality gas channels; a dielectric faceplate comprising a first surface and a second surface opposite to the first surface defining a dielectric faceplate thickness, a plurality of dielectric resonators protruding from the first surface and arranged in a pattern and configured to mount through the plurality of resonator openings when assembled, each of the plurality of dielectric resonators having geometric center and an opening to receiving a microwave antenna; a plurality of dielectric faceplate gas openings extending through the dielectric faceplate thickness in fluid communication with the plurality of the conductive plate gas openings; a plurality of o-rings surrounding the conductive plate gas openings and the dielectric faceplate gas openings and configured to seal the dielectric faceplate gas openings and the conductive plate gas openings from atmospheric pressure; and a conductive insert having a length disposed within at least one of the plurality of dielectric faceplate gas openings, the conductive insert having a length with an aperture extending through the length of the insert, the aperture having an inner diameter.

In another embodiment, a microwave plasma processing chamber comprises a plasma showerhead assembly described according to one or more embodiments. The microwave plasma processing chamber further comprises a substrate processing region; and a microwave plasma power supply configured to generate a microwave plasma that is delivered through the plasma showerhead assembly.

Another aspect of the disclosure pertains to a method of processing a substrate in a microwave plasma processing chamber including depositing a film on the substrate. The method comprises generating a microwave plasma either remotely or locally, delivering the microwave plasma through the showerhead assembly as described herein comprising a dielectric faceplate having gas openings therein and o-rings, and attenuating the plasma with one or more conductive inserts in the dielectric faceplate gas openings or a conductive insert or shield protecting the o-rings. In one or more embodiments of the method, the showerhead assembly comprises the features described herein. The method includes flowing a plasma through the plurality of dielectric faceplate gas openings, at least one of the dielectric faceplate gas openings having a conductive insert positioned therein, the conductive insert having a length with an aperture extending through the length of the insert, the aperture having an inner diameter.

Another aspect of the disclosure pertains to a method of reducing defects in a plasma processing chamber, the method comprising inserting a conductive insert within at least one of a plurality of dielectric faceplate gas openings extending through a thickness of a faceplate, the conductive insert having a length with an aperture extending through the length of the insert, the aperture having an inner diameter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of the present disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
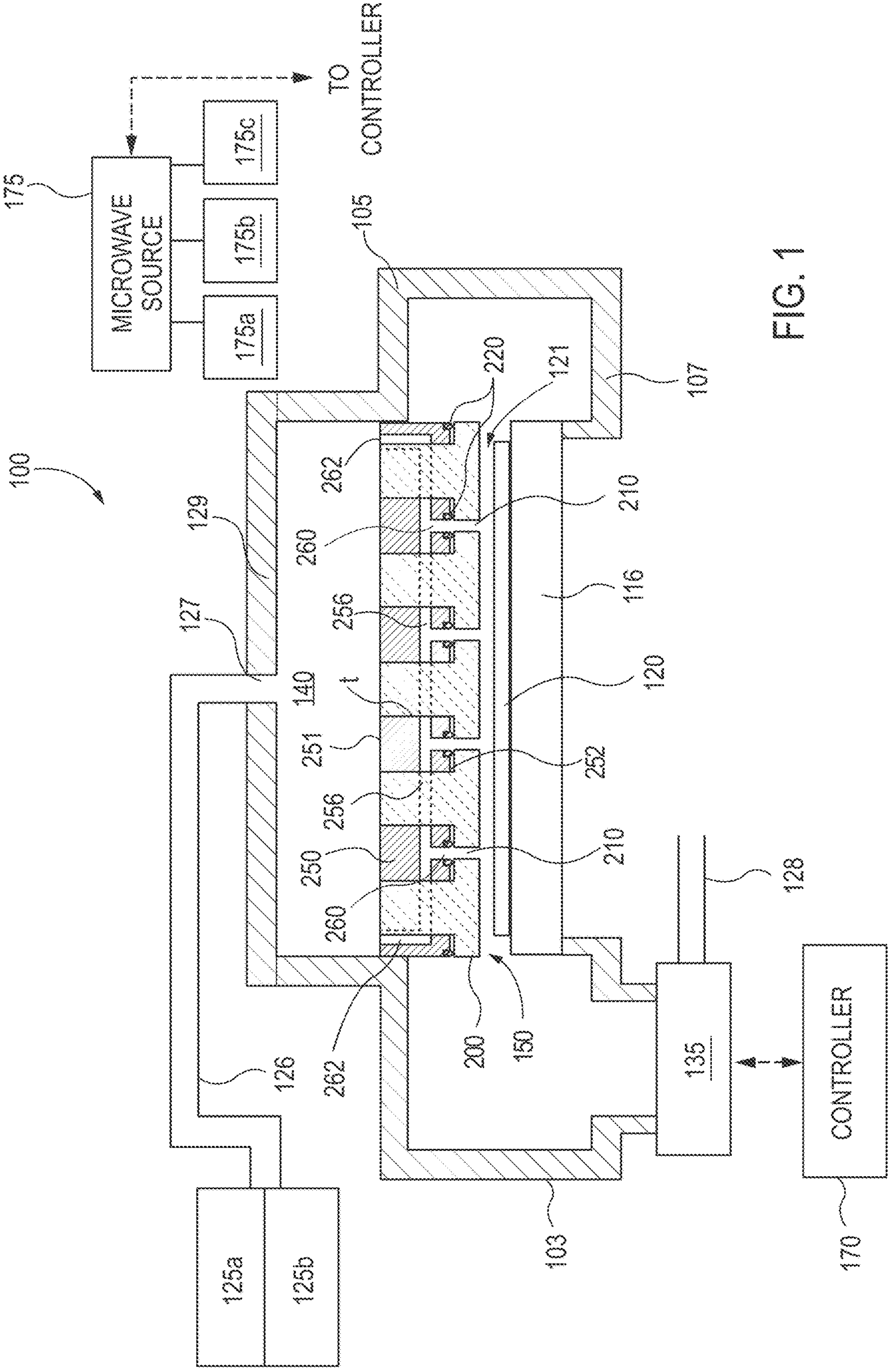
FIG. 1 illustrates a sectional view of a plasma chamber according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±2%, ±1%, ±0.5%, or ±0.1%.

Spatially relative terms, such as "beneath," "below," "lower," "above," "upper" and the like, may be used herein for ease of description to describe one element or feature's relationship to another element(s) or feature(s) as illustrated in the Figures. It will be understood that the spatially relative terms are intended to encompass different orientations of a device in use or operation in addition to the orientation depicted in the figures. For example, if the device in the Figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better describe the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as a metallic material, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a first purge gas, such as argon or nitrogen, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., hydrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. As used herein, the term "thermal process(es)" refers to a deposition technique that does not involve the use of plasma. As used herein, the term "plasma" refers to a composition have ionically charged species and uncharged neutral and radical species.

Plasma-enhanced atomic layer deposition (PEALD) methods add a plasma exposure to traditional ALD methods. In some PEALD methods, a nitrogen source is provided as the plasma. PEALD methods provide for a relatively low substrate temperature, e.g., less than or equal to 600° C., during processing. PEALD may also utilize a single plasma exposure to perform both a precursor-nitrogen reaction step and a film deposition or densification step.

As a non-limiting example, PEALD of silicon nitride ($Si_xN_y$) films are used in many semiconductor applications to improve film quality provided by low temperature thermal processes. The skilled artisan will recognize that the use of a molecular formula such as $Si_xN_y$ does not imply specific stoichiometric relation between the elements but merely the identity of the major components of the film. In some embodiments, the major composition of the specified film (i.e., the sum of the atomic percent of the specified atoms) is greater than or equal to about 95%, 98%, 99%, 99.5%, or 99.9% of the film, on an atomic basis. In one or more embodiments, the silicon nitride ($Si_xN_y$) film comprises $Si_3N_4$.

A plasma is formed in the substrate processing chamber. The precursor and/or reactant gases that flow through a showerhead react with the plasma to deposit a thin layer or film of material on the surface of the substrate that is positioned on a substrate support. Some PEALD substrate processing chambers use capacitive plasma sources in RF/VHF frequency band up to several tens of MHz, for example at 13.6 MHz or 60 MHz. Capacitive plasmas have moderate plasma densities and can have relatively high ion energies. On the other hand, microwave plasmas operating at frequencies at greater than 300 MHz, for example, 2.45 GHz, and have very high charge and plasma densities compared to capacitive plasma sources. The typical plasma densities can be one or two order higher than RF plasma and ion energies can be as low as less than 10 eV. The plasma densities in some embodiments range from $10^{12}/cm^3$ to $10^{13}/cm^3$ and ion energies in some embodiments are less than 10 eV. Such plasma features are becoming increasingly important to deposit high quality films at lower wafer temperature in damage-free processing of modern silicon devices.

Showerhead assemblies used in microwave plasma processes are comprised of a dielectric faceplate and a plurality of gas openings in the dielectric faceplate. The dielectric faceplate is made from a dielectric material such as alumina (AlOx), quartz (SiOx) and aluminum nitride (AlN). The dielectric faceplate may contain metal impurities such as Mg, Cu, and Fe. Plasma showerheads that are used in microwave plasma processes that utilize higher plasma densities are prone to plasma light up inside gas openings in the dielectric faceplate. Embodiments of the disclosure advantageously provide improved showerhead assemblies, which prevent particle and defect generation from gas openings in higher plasma density PEALD deposition processes, in particular, processes that utilize microwave plasmas.

Embodiments of the disclosure advantageously provide effective approaches for defect reduction in microwave plasma showerhead assemblies. Some embodiments improve microwave plasma source reliability. Some embodiments provide conductive inserts placed adjacent to or withing gas openings in the showerhead assembly to mitigate plasma light up inside the gas openings to protect o-rings and reduce defects generated during plasma processing.

Existing microwave PEALD chambers can have defects resulting in formation of greater than or equal to 5, 6, 7, 8, 9 or 10 adders on the microwave pedestals due to plasma light-up in the showerhead assembly gas openings. Some embodiments of the disclosure provide methods for reducing plasma light up inside the gas openings, which protects the O-rings and reduces the thick film deposition inside the dielectric faceplate gas openings. In some embodiments, a metal liner, for example, a cylindrical conductive insert is placed within the gas openings. In other embodiments a conductive insert or metal liner is placed to adjacent the o-rings to shield the o-rings from plasma light up.

Advantageously, the gas openings with the conductive inserts disclosed herein reduce plasma light up in the gas openings of the showerhead assembly, which degrades o-rings that surround the gas openings to directly exposing the o-rings to microwave radiation and thermal heating. Degradation of the o-rings subsequently causes fluorine outgassing and defects during processing of substrates in a substrate processing chamber. Plasma light up in the gas openings also results in shortening of the lifetime of the plasma source, which requires frequent refurbishment. Embodiments of the disclosure provide for reduced plasma light up in the gas openings and improved microwave source reliability in the substrate processing chamber.

The embodiments of the disclosure are described by way of the Figures, which illustrate processes and apparatuses in accordance with one or more embodiments of the disclosure. The processes and resulting showerhead assemblies shown are merely illustrative of the disclosed processes, and the skilled artisan will recognize that the disclosed processes are not limited to the illustrated embodiments.

In the following description, numerous specific details are set forth in order to provide a thorough understanding of the embodiments of the disclosure. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

FIG. 1 is a cross-sectional view of a microwave plasma processing chamber 100 according to one or more embodiments. The microwave plasma processing chamber 100 has a sidewall 103, a top wall 105, and a bottom wall 107 which enclose a process volume 121. A substrate pedestal 116, which supports a substrate 120, mounts to the bottom wall 107 of the microwave plasma processing chamber 100. In certain embodiments, the substrate pedestal 116 is heated and/or cooled by use of embedded heat transfer fluid lines (not shown), or an embedded thermoelectric device (not shown), to improve the plasma process results on the substrate 120 surface. A vacuum pump 135 controls the pressure within the microwave plasma processing chamber 100, at a pressure in a range of from 0.5 Torr to about 10 Torr, for example, from about 0.5 Torr to 5 Torr. A plasma showerhead assembly 150 configured to distribute gases into the process volume 121 comprises a dielectric faceplate 200 and a conductive plate 250, which are described in more respect to FIG. 2. A gas distribution plenum 140 is connected to a process gas supply 125*a* and a reactive gas supply 125*b* via a gas supply line 126 which delivers the process gas and the reactive gas via a gas inlet 127 through a lid 129 of the gas distribution plenum 140. For ease of illustration, not all of the features of the gas distribution plenum 140 are shown in FIG. 1 and more detailed features according to an exemplary embodiment of a gas plenum including supply lines is shown in FIG. 3.

While one gas supply line 126 is shown in FIG. 1, more than one gas supply line 126 can be utilized to separately deliver a process gas from the process gas supply 125*a* and the reactive gas supply 126*b*. The process gas delivered from the process gas supply 125*a* and the reactive gas delivered from the reactive gas supply 126*b* flow through the gas distribution plenum 140 and a plurality of dielectric faceplate gas openings 210 in the dielectric faceplate 200 of the plasma showerhead assembly 150 to the process volume 121 which provides substrate processing region. In one or more embodiments, the plasma showerhead assembly 150 comprises the dielectric faceplate 200 made from a dielectric material such as alumina (AlOx), quartz (SiOx) and aluminum nitride (AlN) and the conductive plate 250 is made from a metal material (e.g., anodized aluminum). An exhaust line 128 is configured to remove reaction byproducts from the microwave plasma processing chamber 100.

In certain embodiments, the microwave source 175 may include microwave amplification circuitry 175*a*. In some embodiments, a voltage control circuit 175*b* provides an input voltage to a voltage controlled oscillator 175*c* configured to produce microwave radiation at a desired frequency that is transmitted to the solid state microwave amplification circuitry 175*a* in the microwave source 175. After processing by the microwave amplification circuitry 175*a*, the microwave radiation is transmitted to the gas distribution plenum 140. A controller 170 is configured to control the microwave source 175, including the microwave amplification circuitry 175*a* and the voltage control circuit 175*b*, and the PECVD process to apply deposit a film on the substrate 120. The controller 170 is further configured to control operation of the vacuum pump 135, delivery of the process gas and the reactive gas from the process gas supply 125*a* and the reactive gas supply 125*b*.

Figure 2:
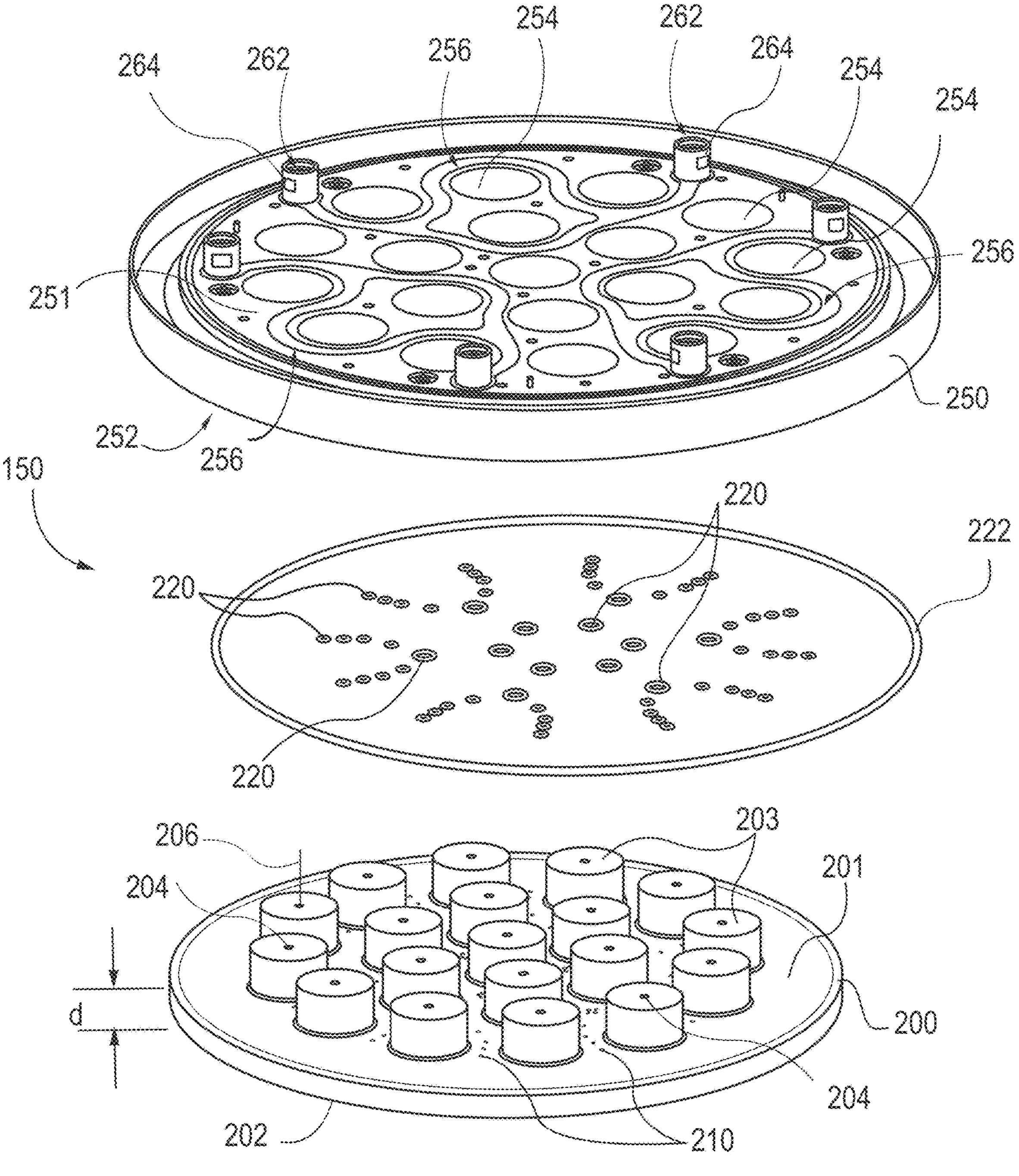
FIG. 2 illustrates an exploded perspective view of a showerhead that can be used in the plasma chamber of FIG. 1 according to one or more embodiments.
Figure 3:
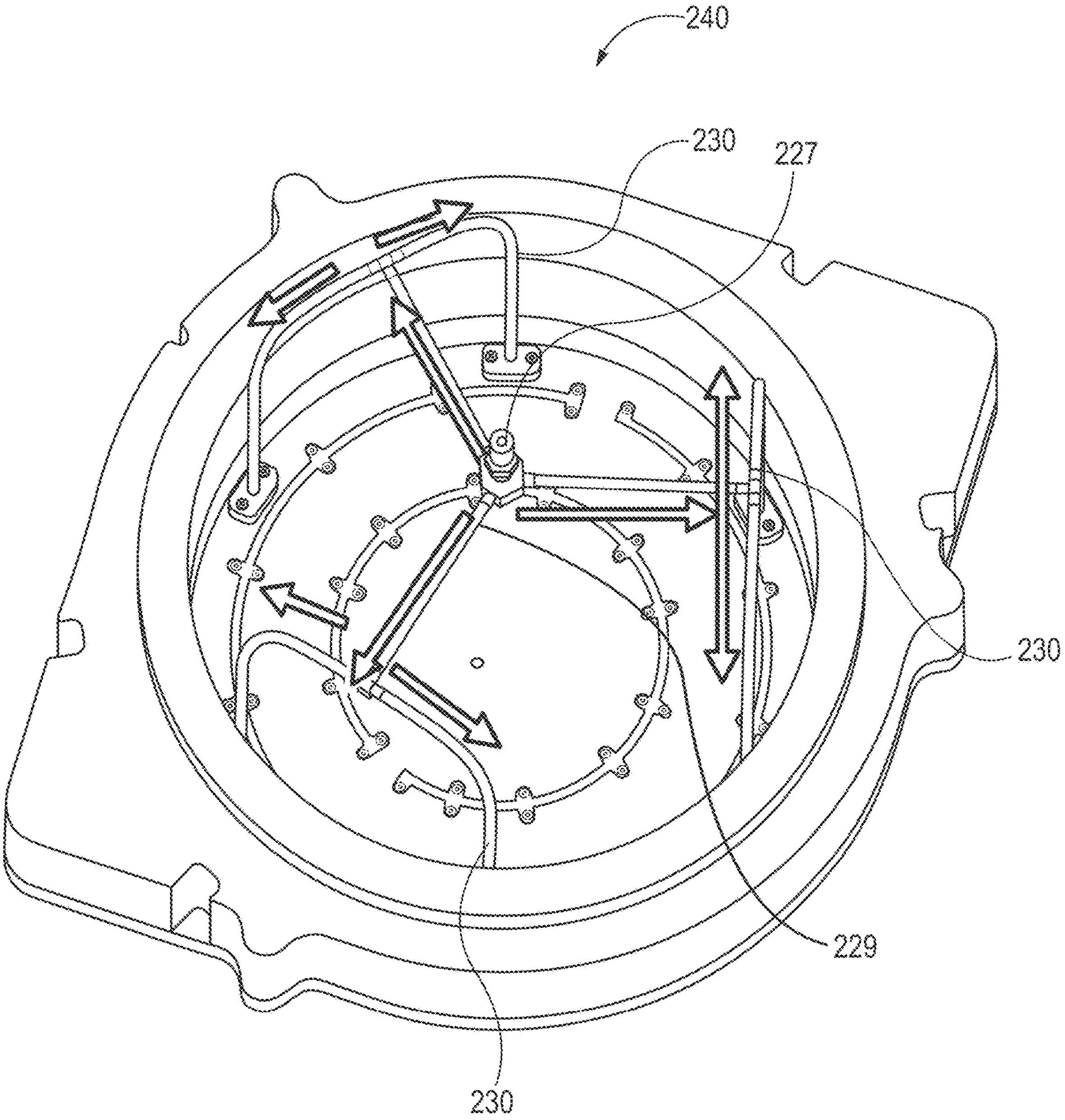
FIG. 3 illustrates a top perspective view of a plenum with that can be used in the plasma chamber of FIG. 1 according to one or more embodiments of the disclosure.

FIG. 2 is an exploded perspective view of a plasma showerhead assembly 150 according to an exemplary embodiment, and FIG. 3 shows the gas distribution plenum 140 including gas delivery lines. The plasma showerhead assembly 150 comprises a dielectric faceplate 200 fitted together with a conductive plate 250. Referring to FIG. 2, the plasma showerhead assembly 150 comprises the conductive plate 250 including a first surface 251 and a second surface 252 opposite to the first surface 251 and defining a conductive plate thickness "t" shown in FIG. 1. The conductive plate 250 further comprises a plurality of resonator openings 254 extending through the conductive plate thickness defined by the first surface 251 and the second surface 252. A plurality of gas channels 256 are formed between the first surface 251 and the second surface 252 of the conductive plate 250. The plurality of gas channels 256 extend laterally through the thickness "t" of the of conductive plate 250. A plurality of conductive plate gas openings 260 extend from the second surface 252 of the conductive plate 250 in fluid communication with the plurality of gas channels 256.

FIG. 3 shows an embodiment of a plenum 240 showing additional details that are not shown in the gas distribution plenum 140 shown in FIG. 1. The details shown in FIG. 2 and FIG. 3 are exemplary only and the gas channels and connections to the gas supplies can be configured in a different manner than shown herein. FIG. 3 shows a gas inlet 227 configured to receive process gas(es) and reactive gas(es) delivered from respective gas supplies, for example the process gas supply 125*a* and a reactive gas supply 125*b* shown in FIG. 1. Three lateral gas conduits 229 are in fluid communication with three connector conduits 230 that are in the form of an inverted U-shape. Gases entering the gas inlet 227 flow in the direction of the hollow arrows in FIG. 3 to the three connector conduits 231. The connector conduits 230 are connected to three receiving flanges 264 on the first surface 251 of the conductive plate, which provide conductive plate inlets 262 to supply gas to the plurality of gas channels 256 extending laterally through the thickness "t" of the of conductive plate 250 and to the plurality of conductive plate gas openings 260 in the conductive plate 250.

The dielectric faceplate 200 comprises a first surface 201 and a second surface 202 opposite to the first surface defining a dielectric faceplate thickness "d", a plurality of dielectric resonators 203 protruding from the first surface 201 and arranged in a pattern and configured to mount through the plurality of resonator openings 254 when the dielectric faceplate 200 and the conductive plate 250 are assembled. Each of the plurality of dielectric resonators 203 having geometric center and an opening 204 configured to receive a microwave antenna 206. In some embodiments, the microwave antenna 206 is a monopole antenna. In the embodiment shown, the opening 204 configured to receive the microwave antenna 206 is in the geometric center of each of the dielectric resonators 203. Only one microwave antenna 206 is shown in FIG. 2, but it will be understood that in some embodiments each of the dielectric resonators 203 will have a microwave antenna 206 mounted in the opening 204 located at the geometric center of each dielectric resonator 203.

The dielectric faceplate 200 further comprises a plurality of dielectric faceplate gas openings 210 extending through the dielectric faceplate thickness "d" in fluid communication with the plurality of the conductive plate gas openings 260. As will be explained in more detail, the dielectric faceplate gas openings 210 may be arranged in a pattern on the dielectric faceplate 200.

Referring to FIG. 1 and FIG. 2, a plurality of o-rings 220 surround the conductive plate gas openings 260 and the dielectric faceplate gas openings and configured to seal the dielectric faceplate gas openings 210 and the conductive plate gas openings 260 from atmospheric pressure when the plasma showerhead assembly 150 is assembled together. A peripheral o-ring 222 may be provided, which, when the plasma showerhead assembly 150 is assembled, surrounds the dielectric resonators 203. The plasma showerhead assembly 150 is assembled by placing the plurality of o-rings 220 and the peripheral o-ring 222 on the first surface 201 of the dielectric faceplate 200, and then placing the conductive plate 250 on the first surface 201 of the dielectric faceplate 200 so that the second surface of the conductive plate 250 is resting upon the plurality o-rings 220 and facing the first surface 201 of the dielectric faceplate 200. While not shown, fasteners such as screws or bolts may be used to fasten the conductive plate 250 to the dielectric faceplate 200.

Thus, when the plasma showerhead assembly 150 is fully assembled, the conductive plate gas openings 260 are aligned with the dielectric faceplate gas openings. Gas that flows from the conductive plate gas openings 260 flows through the dielectric faceplate gas openings to the process volume 121 in the microwave plasma processing chamber 100 according to one or more embodiments.

Referring now to FIGS. 4A-4D, according to one or more embodiments, a plasma showerhead assembly 150 comprises a conductive plate 250 including a first surface 251 and a second surface 252 opposite to the first surface 251 defining a conductive plate thickness "t" and a plurality of resonator openings 254 extending through the conductive plate thickness "t". There is a plurality of gas channels 256 formed between the first surface 251 and the second surface 252 of the conductive plate 250, and a plurality of the conductive plate gas openings 260 extending from the second surface 252 of the conductive plate in fluid communication with the plurality gas channels 256.

The plasma showerhead assembly further comprises a dielectric faceplate 200 comprising a first surface 201 and a second surface 202 opposite to the first surface 201 defining a dielectric faceplate thickness "d". There is a plurality of dielectric resonators 203 protruding from the first surface 201 and arranged in a pattern and configured to mount through the plurality of the resonator openings 254 when assembled. Each of the plurality of dielectric resonators 203 has geometric center and an opening 204 located at the geometric center and configured to receive a microwave antenna 206. While only a one of the dielectric resonators 203 is shown as having a microwave antenna 206 mounted in the opening, it will be understood that in one or more embodiments, each of the dielectric resonators will have a microwave antenna 206 mounted in the openings 204 located at geometric center of the dielectric resonator 203. There is a plurality of dielectric faceplate gas openings 210 extending through the dielectric faceplate thickness "d" in fluid communication with the plurality of the conductive plate gas openings 260. A plurality of o-rings 220 surround the conductive plate gas openings 260 and the dielectric faceplate gas openings 210 and are configured to seal the dielectric faceplate gas openings 210 and the conductive plate gas openings 260 from atmospheric pressure.

A conductive insert 212 having a length "L" disposed within at least one of the plurality of dielectric faceplate gas openings, the conductive insert an aperture 213 extending through the length "L" of the insert, the aperture 213 having an inner diameter. When the dielectric faceplate 200 is assembled to the conductive plate, the o-rings 220 are disposed between the second surface 252 of the conductive plate and the first surface 201 of the dielectric faceplate, providing a seal around the dielectric faceplate gas openings 210 and the conductive plate gas openings 260 that are in fluid communication with each other.

The conductive inserts 212 may comprise any suitable conductive material, for example aluminum, nickel, titanium, molybdenum, doped silicon and alloys comprising a combination of one or more aluminum, nickel, titanium, molybdenum, and doped silicon. In some embodiments, if the conductive inserts contain impurities selected from the group consisting of copper, magnesium and iron, to prevent out diffusion of the impurities, a coating layer on the conductive insert may be provided on the conductive insert. In some embodiments, the conductive inserts are inserted into the dielectric faceplate gas openings 210, and a dielectric coating material is deposited on the conductive inserts by plasma enhanced chemical vapor deposition or plasma enhanced atomic layer deposition. In other embodiments, the coating may be applied to the conductive inserts 212 prior to placing the conductive inserts 212 within the dielectric faceplate gas openings 210. The dielectric material coating is selected from the group consisting of one or more of aluminum oxide ($Al_2O_3$), yttrium oxide ($Y_2O_3$), silicon oxide ($SiO_2$), silicon nitride is provided on the insert. The thickness of the coating has a thickness in a range of 100 nm to 1000 nm.

In one or more embodiments, the conductive inserts 212 conform to the shape of the dielectric faceplate gas openings 210. In some embodiments, the conductive inserts 212 are cylindrical and have an inner diameter aperture size in a range of from 0.2 mm to 2 mm. The conductive inserts 212 can be conveniently located in various locations in the dielectric faceplate gas openings 210.

Figure 4A:
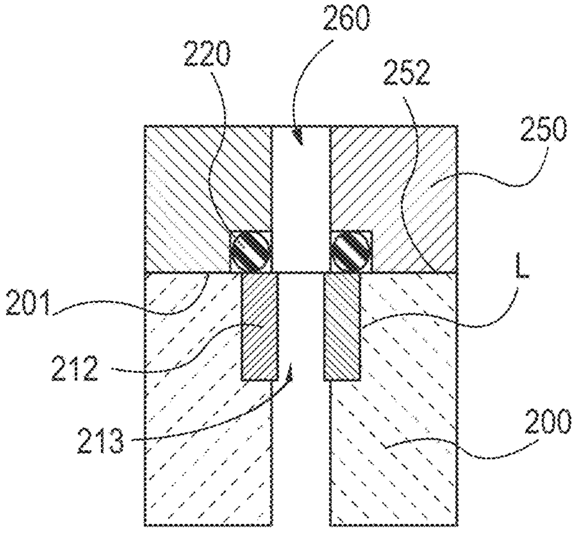
FIG. 4A illustrates an enlarged partial cross-sectional view of a showerhead gas opening with an insert in the dielectric faceplate gas opening.
Figure 5A:
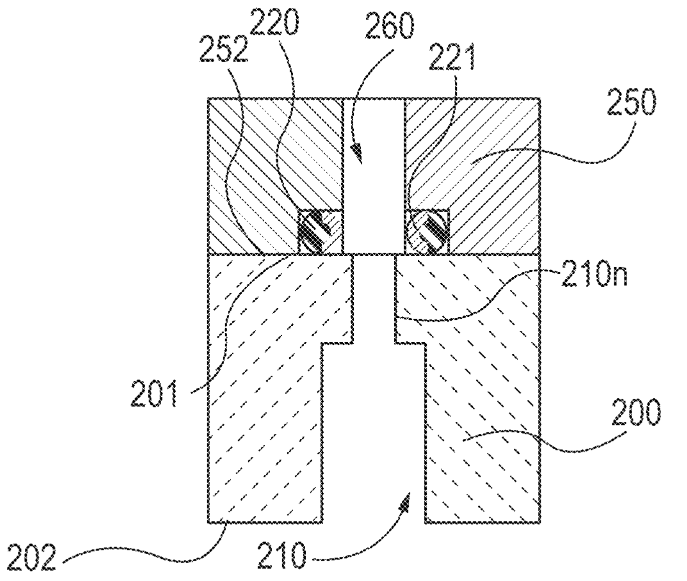
FIG. 5A illustrates an enlarged partial cross-sectional view of a showerhead gas opening with an insert protecting the o-ring.

Referring now to FIG. 4A, In some embodiments, when the dielectric faceplate 200 and the conductive plate 250 are assembled together the o-rings 220 are at an interface at which the second surface 252 of the conductive plate 250 and the first surface 201 of the dielectric faceplate. FIG. 4A shows the conductive insert 212 disposed adjacent to the first surface 201 of the dielectric faceplate 200. The length "L" extends along a portion of the thickness "d" of the dielectric faceplate 200. In FIG. 5A, the length "L" of the insert extends less than 50% of the thickness of the dielectric faceplate 200. The conductive insert has an aperture 213 has a diameter that is approximately equal to the diameter of the conductive plate gas opening 260. As used herein, "approximately equal" refers to the diameters of the aperture being within 10% of the diameter of the conductive plate gas opening 260.

Figure 4B:
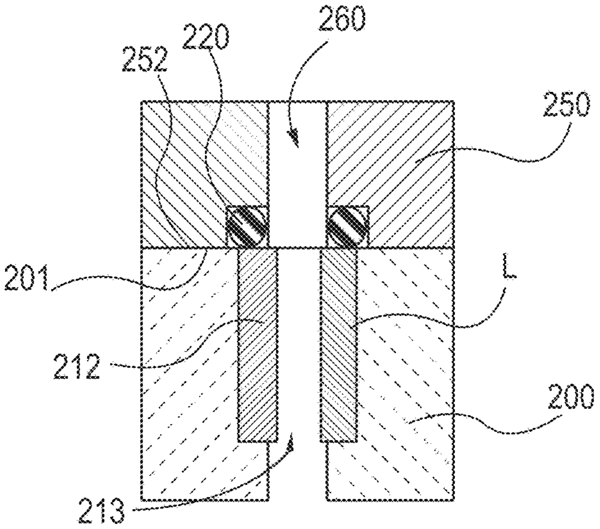
FIG. 4B illustrates an enlarged partial cross-sectional view of an alternate embodiment of a showerhead gas opening with an insert in the dielectric faceplate gas opening.

FIG. 4B shows the conductive insert 212 disposed adjacent to the first surface 201 of the dielectric faceplate 200. Also, in FIG. 4B the conductive insert has a length "L" that is greater than 50% of the thickness "d" of the dielectric faceplate 200. The conductive insert has an aperture 213 having a diameter that is approximately equal to the diameter of the conductive plate gas opening 260.

Figure 4C:
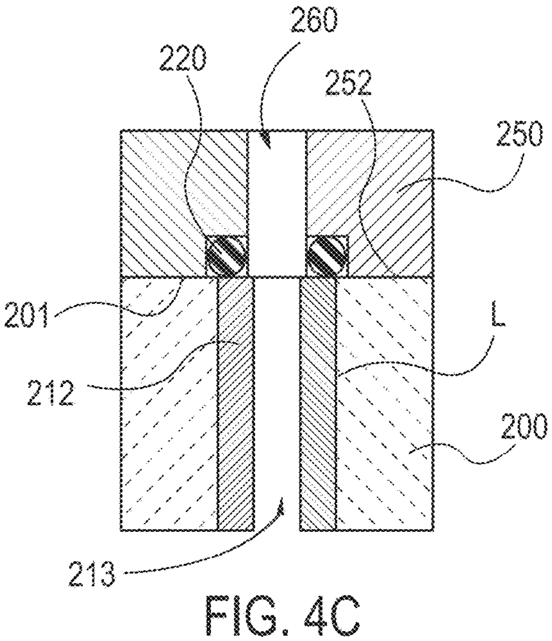
FIG. 4C illustrates an enlarged partial cross-sectional view of an alternate embodiment of a showerhead gas opening with an insert in the dielectric faceplate gas opening.

FIG. 4C shows the conductive insert 212 disposed adjacent to the first surface 201 of the dielectric faceplate 200. Also, in FIG. 4D the conductive insert has a length "L" that is 100% of the thickness "d" of the dielectric faceplate 200. The conductive insert has an aperture 213 having a diameter that is approximately equal to the diameter of the conductive plate gas opening 260.

Figure 4D:
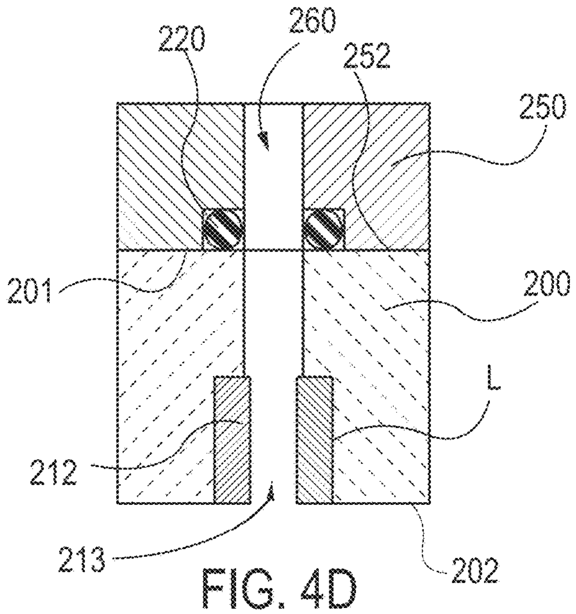
FIG. 4D illustrates an enlarged partial cross-sectional view of an alternate embodiment of a showerhead gas opening with an insert in the dielectric faceplate gas opening.

FIG. 4D shows the conductive insert 212 disposed adjacent to the second surface 202 of the dielectric faceplate 200. Also, in FIG. 4D the conductive insert has a length "L" that is less than 50% of the thickness "d" of the dielectric faceplate 200. The conductive insert has an aperture 213 that has a diameter that is approximately equal to the diameter of the conductive plate gas opening 260. It will be appreciated that in other variants of the embodiment shown in FIG. 4D, the conductive insert can have a length "L" that is greater than 50% of the thickness "d" of the dielectric faceplate 200. In some embodiments, the conductive insert has a length "L" that is from 10-20%, 10-30%, 10-40%, 10-50%, 10-60%, 10-70%, 10-80% or 10-90% of the thickness "d" of the dielectric faceplate.

Figure 5B:
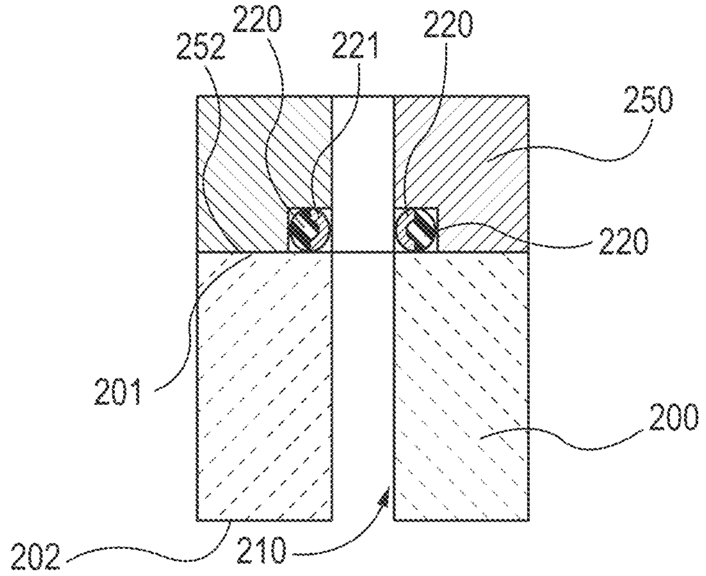
FIG. 5B illustrates an enlarged partial cross-sectional view of an alternate embodiment of a showerhead gas opening with an insert protecting the o-ring.

Referring now to FIG. 5A, an embodiment is shown where the dielectric faceplate 200 has a dielectric faceplate gas opening 210 that has diameter that is larger at the second surface 202 than at the first surface. In FIG. 5B, the diameter at the first surface 201 and the second surface 202 are approximately equal to each other. In FIGS. 5A and 5B, a conductive insert 221 is disposed and surrounds a portion of the o-ring that is adjacent to the conductive plate gas opening 260. The conductive insert 221 forms a a shield or a lining that protects the o-ring from exposure to the microwave radiation that lights up in the dielectric faceplate gas opening 210 during operation of the microwave plasma processing chamber 100. The conductive insert 221 protects the o-ring from damage and causing defects on in the microwave plasma processing chamber 100.

The plasma showerhead assembly 150 according to one or more embodiments may be installed in a microwave plasma processing chamber 100, for example, of the type shown in FIG. 1. Thus, a microwave plasma processing chamber configured for processing substrates using a microwave plasma may be arranged as shown in FIG. 1 and include the process volume 121, which is generally the space between the plasma showerhead assembly 150 and the substrate pedestal 116 which supports the substrate 120 during a substrate processing method. The microwave plasma processing chamber further includes a microwave plasma power supply configured to generate a microwave plasma that is delivered through the plasma showerhead assembly as shown and described with respect to FIG. 1.

One or more additional embodiments of the present disclosure comprise a method of processing a substrate in a microwave plasma processing chamber comprising generating a microwave plasma either remotely or locally, delivering the microwave plasma through the showerhead assembly as described herein comprising gas openings and o-rings, and protecting the with metal inserts disposed within the dielectric faceplate gas openings 210 as described with respect to FIGS. 4A-D and/or adjacent to the o-rings 220 as described with respect to FIGS. 5A-B. In one or more embodiments of the method, the showerhead assembly comprises the features described herein.

Another aspect of the disclosure pertains to a method of reducing defects in a plasma processing chamber, the method comprising inserting a conductive insert within at least one of a plurality of dielectric faceplate gas openings extending through a thickness of a faceplate, the conductive insert having a length with an aperture extending through the length of the insert, the aperture having an inner diameter. The conductive insert according to one or more embodiments comprises the features described with respect to FIGS. 4A-D, which describe the conductive insert disposed within the dielectric faceplate gas openings and FIGS. 5A-B, which describe an insert or shield that protects the o-rings 220 adjacent to the conductive plate gas opening 260 and the dielectric faceplate gas opening 210.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A plasma showerhead assembly comprising:

a conductive plate including a plurality of gas channels and a plurality of conductive plate gas openings;

a dielectric faceplate comprising a plurality of dielectric resonators and a plurality of dielectric faceplate gas openings in fluid communication with the plurality of the conductive plate gas openings, the dielectric faceplate configured to be assembled to the conductive plate;

a plurality of o-rings surrounding the plurality of conductive plate gas openings and the plurality of dielectric faceplate gas openings and configured to seal the plurality of dielectric faceplate gas openings and the plurality of conductive plate gas openings from atmospheric pressure; and a conductive insert disposed within at least one of the plurality of dielectric faceplate gas openings, the conductive insert having a length with an aperture extending through the length of the conductive insert, the aperture having an inner diameter.

2. The plasma showerhead assembly of claim 1, wherein the conductive insert comprises a conductive material.

3. The plasma showerhead assembly of claim 2, wherein the conductive material is selected from the group consisting of aluminum, nickel, titanium, molybdenum, doped silicon and alloys comprising a combination of one or more aluminum, nickel, titanium, molybdenum, and doped silicon.

4. The plasma showerhead assembly of claim 2, wherein the dielectric faceplate has a first surface and a second surface opposite to the first surface defining a dielectric faceplate thickness, and the conductive insert has extends along a portion of the thickness of the dielectric faceplate.

5. The plasma showerhead assembly of claim 4, wherein the conductive insert extends from the first surface of the dielectric faceplate.

6. The plasma showerhead assembly of claim 5, wherein the conductive insert extends along at least 25% of the thickness of the dielectric faceplate.

7. The plasma showerhead assembly of claim 5, wherein the conductive insert extends along 25%-50% of the thickness of the dielectric faceplate.

8. The plasma showerhead assembly of claim 4, wherein the conductive insert extends along greater than 50% of the thickness of the dielectric faceplate.

9. The plasma showerhead assembly of claim 4, wherein the conductive insert extends along 100% of the thickness of the dielectric faceplate.

10. The plasma showerhead assembly of claim 4, wherein the conductive insert extends from the second surface of the dielectric faceplate.

11. The plasma showerhead assembly of claim 10, wherein the conductive insert extends along at least 25% of the thickness of the dielectric faceplate.

12. The plasma showerhead assembly of claim 10, wherein the conductive insert extends along 25%-50% of the thickness of the dielectric faceplate.

13. The plasma showerhead assembly of claim 10, wherein the conductive insert extends along greater than 50% of the thickness of the dielectric faceplate.

14. The plasma showerhead assembly of claim 10, wherein the conductive insert extends along 100% of the thickness of the dielectric faceplate.

15. The plasma showerhead assembly of claim 2, wherein the conductive insert surrounds a portion of at least one of the plurality of o-rings.

16. The plasma showerhead assembly of claim 15, wherein the conductive insert provides a shield to the at least one of the plurality of o-rings and prevents microwave plasma from damaging the at least one of the plurality of o-rings.

17. A microwave plasma processing chamber comprising:

the plasma showerhead assembly of claim 2;

a substrate processing region; and a microwave plasma power supply configured to generate a microwave plasma that is delivered through the plasma showerhead assembly.

18. A method of processing a substrate in the microwave plasma processing chamber of claim 17, the method comprising:

generating a microwave plasma and delivering the microwave plasma through the plasma showerhead assembly; and attenuating the microwave plasma with the conductive insert.

19. A method of reducing defects in the microwave plasma processing chamber of claim 17, the method comprising inserting the conductive insert within the at least one of the plurality of dielectric faceplate gas openings.

* * * * *